United States Patent
Bassett et al.

(10) Patent No.: US 6,947,273 B2
(45) Date of Patent: Sep. 20, 2005

(54) POWER, GROUND, AND ROUTING SCHEME FOR A MICROPROCESSOR POWER REGULATOR

(75) Inventors: Keith Bassett, Torrance, CA (US); Tim Ng, Monterey Park, CA (US); Ken Ostrom, Palos Verdes Estates, CA (US); Nicholas Steffen, Redondo Beach, CA (US); Benjamin Tang, Hawthorne, CA (US); Robert Carroll, Andover, MA (US)

(73) Assignee: Primarion, Inc., Tempe, AZ (US)

( * ) Notice: Subject to any disclaimer, the term of this patent is extended or adjusted under 35 U.S.C. 154(b) by 80 days.

(21) Appl. No.: 10/165,470

(22) Filed: Jun. 7, 2002

(65) Prior Publication Data

US 2003/0029631 A1 Feb. 13, 2003

Related U.S. Application Data

(63) Continuation-in-part of application No. 10/104,039, filed on Mar. 22, 2002, now Pat. No. 6,819,537, and a continuation-in-part of application No. 09/771,756, filed on Jan. 29, 2001, now Pat. No. 6,429,630.

(60) Provisional application No. 60/343,941, filed on Dec. 26, 2001, and provisional application No. 60/298,131, filed on Jun. 7, 2001.

(51) Int. Cl.[7] .............................. H02H 3/22; H02H 9/04
(52) U.S. Cl. ........................................ 361/111; 361/54
(58) Field of Search .................. 361/111, 54; 327/310, 327/309; 257/355, 356

(56) References Cited

U.S. PATENT DOCUMENTS

| | | | | |
|---|---|---|---|---|
| 5,016,080 A | * | 5/1991 | Giannella | 357/45 |
| 5,079,612 A | * | 1/1992 | Takamoto et al. | 357/41 |
| 5,521,530 A | * | 5/1996 | Yao et al. | 326/80 |
| 5,548,135 A | * | 8/1996 | Avery | 257/173 |
| 5,717,229 A | * | 2/1998 | Zhu | 257/208 |
| 5,821,804 A | * | 10/1998 | Nikutta et al. | 327/382 |
| 5,991,135 A | * | 11/1999 | Saleh | 361/56 |
| 6,366,506 B1 | * | 4/2002 | Mizuno et al. | 365/189.09 |
| 6,411,485 B1 | * | 6/2002 | Chen et al. | 361/111 |
| 6,522,511 B1 | * | 2/2003 | John et al. | 361/56 |
| 6,724,603 B2 | * | 4/2004 | Miller et al. | 361/111 |

OTHER PUBLICATIONS

The Authoritative Dictionary of IEEE Standard Terms, 2000, IEEE Press, 7th Edition, p. 128.*

* cited by examiner

*Primary Examiner*—Brian Sircus
*Assistant Examiner*—Zeev Kitov
(74) *Attorney, Agent, or Firm*—Theodore E. Galanthay

(57) ABSTRACT

A method, apparatus, and system for routing signals in a microelectronic device are disclosed. The system includes a plurality of chip components, such as transient suppression regulators, that are configured to include a transmission path that is routed through the chip component for transmission of any signal, for example, a signal from a communication bus of the microelectronic device.

11 Claims, 7 Drawing Sheets

POWER, GROUND, AND ROUTING SCHEME FOR A MICROPROCESSOR POWER REGULATOR

CROSS-REFERENCE TO RELATED APPLICATIONS

This application claims priority to, and the benefit of, U.S. Provisional Patent Application Ser. No. 60/298,131, entitled POWER, GROUND, AND ROUTING SCHEME FOR A MICROPROCESSOR POWER REGULATOR" and filed Jun. 7, 2001 and U.S. Provisional Patent Application Ser. No. 60/343,941, entitled FINE GRAIN POWER DELIVERY SYSTEM FOR MICROELECTRONIC DEVICES" filed Dec. 26, 2001; and is continuation in part of U.S. Non-provisional patent application Ser. No. 09/771,756, entitled APPARATUS FOR PROVIDING REGULATED POWER TO AN INTEGRATED CIRCUIT" filed on Jan. 29, 2001, now U.S. Pat. No. 6,429,630 and U.S. Non-provisional patent application Ser. No. 10/104,039, entitled POWER REGULATION SYSTEM, APPARATUS, AND METHOD FOR PROVIDING REGULATED POWER TO A MICROELECTRONIC DEVICE" and filed Mar. 22, 2002, now U.S. Pat. No. 6,819,537, which are hereby incorporated by reference in their entirety.

TECHNICAL FIELD

The present invention relates to microelectronic devices. More particularly, the invention relates to techniques for routing electrical signals to a microelectronic device.

BACKGROUND INFORMATION

Microelectronic power regulation systems generally include a power regulator configured to supply a desired, regulated power to a microelectronic device such as microprocessors, microcontrollers, memory devices, and, the like. The system may also include capacitors located near and/or packaged with the microprocessor to supply additional charge during the operation of the microprocessor. Such power regulation systems are configured so that the power regulator (e.g., a switching regulator such as a Buck regulator) provides nominal operating power to the microprocessor and the capacitors supply charge to compensate for transient power demands that result from operation of the microelectronic device. Such transient power demands may occur, for example, when several transistors of the microprocessor switch in the same direction at approximately the same time—e.g., when a portion of the device is powered off to conserve power or a portion of the device is activated.

As the speed and integration of microprocessors increase, the use of power regulation systems that only employ decoupling capacitors to compensate for or regulate transient power demands becomes increasingly problematic. For example, the number and/or size of the capacitors required to account for transient events generally increases as the integration of the microprocessor increases. The capacitors take up a relatively large amount of space on the package and can be relatively expensive. In addition, as the speed and the performance of the microprocessor increases, the severity (e.g., the amplitude) of the transient power demands and the frequency of the events tend to increase. Further, the microelectronic devices often become more sensitive to degraded power waveforms, which result from transient events, as the integration and speed of the devices increase. Capacitors within typical power regulation systems may be unable to adequately regulate such sever transient power demands. If not regulated or filtered, transient power events may result in a power or ground "spike" or "bounce"—i.e., momentary voltage levels below or above the nominal operating voltage of the microelectronic device, which in turn induce bit errors in digital logic of the microelectronic device through degraded noise margin and supply-induced timing violations. Accordingly, improved apparatus for responding to transient events that result during operation of a microelectronic device are desired.

Furthermore, although typical Buck regulators are generally suitable for controlling power to some microprocessors, such regulators are not well suited to supply relatively high current (e.g., greater than about 30 amps) at relatively high speed (e.g., greater than about 100 kHz). One reason that Buck regulators have difficulty supplying high current at high speed to the microprocessor is that the regulator is configured to supply a single core operating voltage (Vcc) to the entire microprocessor. Supplying power from a single source and distributing the power to a limited number of locations of the microprocessor may be problematic in several regards. For example, various portions of the microprocessor may operate more efficiently at different amounts of power—e.g. at different current and/or voltage levels. To compensate for the different power requirements, the microprocessor may require additional components and integration to step the power up or down as needed. Such additional components and integration may undesirably add to the cost and complexity of the microprocessor and systems including the microprocessor. Further, supplying all or most of the power from a single regulated power source requires a relatively large power regulator, which is generally inherently slow to respond to changes in power demands.

Another problem associated with supplying the same operating power to a limited number of locations of a microprocessor is that microprocessor wiring schemes configured to distribute the regulator power to the microprocessor are generally complex and include relatively long wiring sections to supply power to sections of the device located away from the input source of the power. The relatively long wiring sections may cause delay and undesirable signal degradation or loss of the transmitted power. Accordingly, improved methods and apparatus for providing power to a plurality of portions of a microelectronic device and to supply various amounts of power to a plurality of locations on the microprocessor are desired.

SUMMARY OF THE INVENTION

The present invention provides improved apparatus and techniques for routing signals to portions of a microelectronic device. More particularly, the present invention provides improved devices and methods suitable for routing signals through the electrical components of the microelectronic device such that less space is utilized to route signals on the device.

While the way in which the present invention addresses the disadvantages of the prior art will be discussed in greater detail below, in general, the present invention provides for a system suitable for transmitting signals to a plurality of chip components on a microelectronic device.

In accordance with one exemplary embodiment of the present invention, a system for routing signals includes a plurality of components coupled to a substrate, a signal line formed on the substrate, wherein the signal line connects each of the components and each of the components has a transmission path for the signal line. In accordance with one aspect of the present invention, a continuous electrical connection is formed by the signal line and the transmission path of each component. In accordance with another aspect of the present invention, the signal line connects each of the components in a serial pattern. In accordance with yet another aspect of the present invention, the components may comprise transient suppression regulators configured to provide transient suppression power to a microelectronic device.

BRIEF DESCRIPTION OF THE DRAWINGS

A more complete understanding of the present invention may be derived by referring to the detailed description, considered in connection with the figures, wherein like reference numbers refer to similar elements throughout the figures, and.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention is described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where signal transmission to a plurality of components is desired. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components or by connection through other components and devices located therebetween.

The present invention provides electrical routing schemes for providing electrical signals to a plurality of electrical components. While the invention may be practiced in connection with a variety of electrical components, the invention is conveniently described in connection with power regulation circuits and systems.

Figure 1:
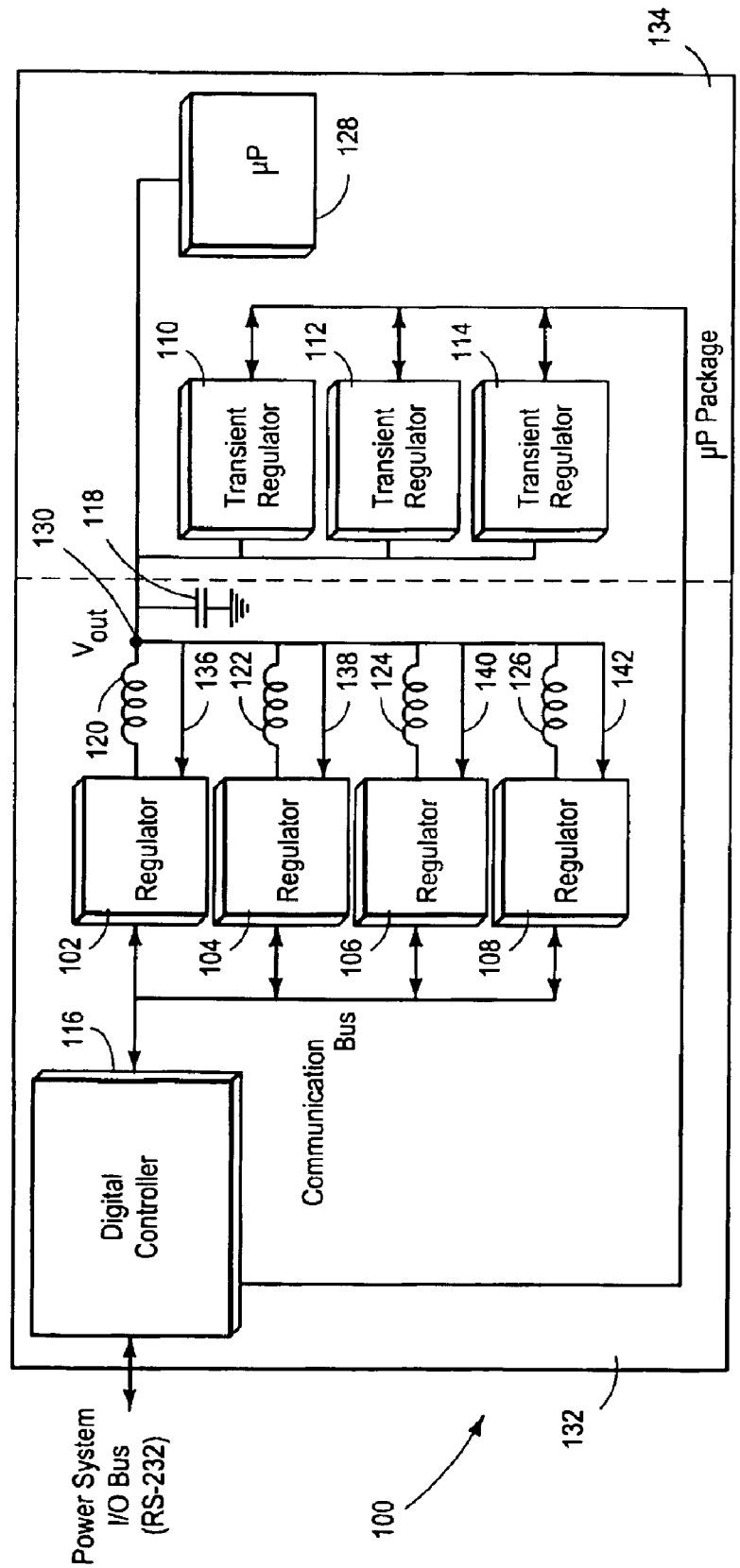
FIG. 1 illustrates a power regulation system in accordance with an exemplary embodiment of the present invention.

FIG. 1 illustrates a power regulation system 100 in accordance with one exemplary embodiment of the present invention. System 100 includes primary power regulators 102–108, transient suppression regulators 110–114, and a controller 116. System 100 may also suitably include one or more capacitors 118 and one or more inductors 120–126 coupled to a load 128. The capacitors and inductors may comprise discrete components and/or may symbolize inherent inductance and capacitance within system 100. Although exemplary system 100 is illustrated with four primary regulators 102–108, three transient regulators 110–114, four inductors 120–126, and one capacitor 118, power regulation systems in accordance with the present invention may include any suitable number of primary regulators, transient suppression regulators, inductors, and capacitors. Furthermore, power regulation systems in accordance with the present invention may include additional components, such as resistors, transistors, additional capacitors and/or inductors, and the like, which are not illustrated in the drawing figures.

In operation, system 100 provides operating power to a microprocessor 128 and also responds to transient events caused by the operation of microprocessor, e.g., a power surge due to, for example, multiple gates with the microprocessor switching in the same direction at about the same time or from a portion of the microprocessor powering up or down. More specifically, operating power and low-frequency (e.g., less than about 100 kHz) transient suppression power is supplied to microprocessor via regulators 102–108 and transient suppression regulators 110–114 supply high-frequency (e.g., greater than about 100 kHz) transient suppression power to the power supply circuit. As discussed in more detail below, regulators 102–108 may be configured to alter operation to respond to actual or predicted transient events and transient suppression regulators 110–114 may be configured to supply power in response to actual or predicted transient power demands from the microprocessor, such that any spikes or droops that would otherwise occur on the power circuit are reduced or eliminated.

As noted above, primary regulators 102–108 are configured to provide nominal operating power to microprocessor 128 and to provide low frequency transient suppression. By way of particular example, regulators 102–108 may be configured to provide about 1.1 volts ± about ten percent at about 100 amps ± ten percent to microprocessor 128 and respond to transient events occurring at less than about 100 kHz. However, regulators having other output voltages and current levels are within the scope of the present invention.

Regulators 102–108 may be configured in a variety of ways, such as, for example, a linear regulator, or a single or multi-phase switching regulator. In accordance with one exemplary embodiment of the invention, regulators 102–108 are three or four phase switching regulators tied to a common voltage node 130, through inductors 120–126. In accordance with alternate embodiments of the invention, regulators 102–108 may be replaced with a single multi-phase switching regulator. An exemplary primary regulator suitable for use with the present invention is described in greater detail in U.S. patent application Ser. No. 09/975,195, entitled SYSTEM AND METHOD FOR HIGHLY PHASED POWER REGULATION, filed Oct. 10, 2001, and U.S. patent application Ser. No. 10/103,980, entitled, SYSTEM, DEVICE AND METHOD FOR PROVIDING VOLTAGE REGULATION TO A MICROELECTRONIC DEVICE, filed Mar. 22, 2002, the contents of which are hereby incorporated herein by reference. Regulators 102–108 may be formed on a single substrate as part of an array or on separate substrates as discrete components. In either case, regulators 102–108 may be coupled to another substrate (e.g., a substrate 132), such as a motherboard or an interposer. In addition, regulators 102–108 may suitably include feedback loops, represented by lines 136–142, to facilitate accurate control of the voltage at node 130. In accordance with one aspect of this embodiment, regulators 102–108 form an array configured to provide about 15 amps or more of power at about 1 MHz switching speed.

Transient regulators 110–114 may also be configured in a variety of ways in accordance with various embodiments of the invention. In general, regulators 110–114 are configured to quickly respond to fast, high frequency power demands. In other words, secondary regulators 110–114 are configured to reduce power spikes or droops in system 100 by providing or sinking power in response to transient power events. In accordance with various embodiments of the invention, regulators 110–114 are configured to sink and/or source current in response to a signal indicative of a transient response. In accordance with other aspects of this embodiment each transient regulator 110–114 is configured to independently respond to transient events that occur at one or more portions of microprocessor 128.

Figure 2:
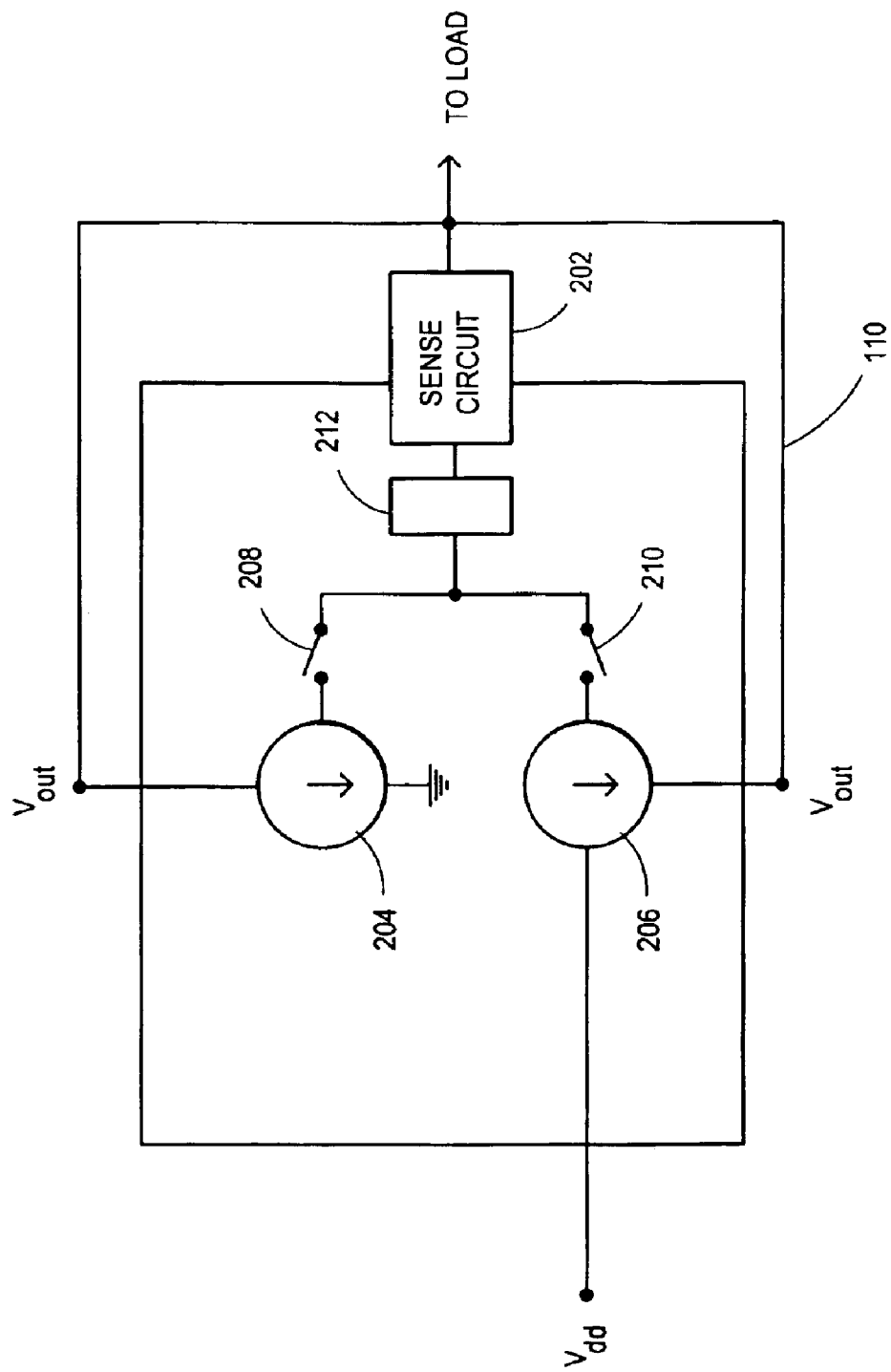
FIG. 2 illustrates an exemplary transient suppression regulator including a sense circuit in accordance with the present invention.

FIG. 2 schematically illustrates a transient power regulator (e.g., regulator 110) in greater detail. In accordance with this embodiment, transient regulator 110 includes a sense circuit 202, a current source 204, a current sink 206, switches 208 and 210, and a controller. In operation, a change in power is detected at circuit 202, which sends a corresponding signal to controller 212, which sends a corresponding signal to switches 208 or 210 to short the appropriate portion of the circuit and consequently sink or supply charge in response to the sensed transient power demand.

Sense circuit 202 may be configured in a variety of ways in accordance with various embodiments of the invention. For example, sense circuit may be configured to sense a change in current, a rate of change of current, a change in voltage, a rate of change of voltage, or any combination thereof. Although illustrated as part of a transient regulator 110, sense circuit 202 may be a discrete component, formed as part of a primary regulator, or formed as an integral part of microprocessor 128. Further, one sense circuit may be used to provide a signal to multiple regulators 110–114. More detailed descriptions of exemplary sense circuits suitable for use in connection with the present invention are described in U.S. patent application Ser. No. 09/945,187, entitled APPARATUS AND SYSTEM FOR PROVIDING TRANSIENT SUPPRESSION POWER REGULATION, filed Aug. 3, 2001 and U.S. patent application Ser. No. 60/361,976, entitled METHOD AND APPARATUS FOR CLOSED LOOP MULTISENSING TRANSIENT POWER REGULATION, filed Mar. 6, 2002, the contents of which are herein incorporated by reference.

Charge sources 204, 206 and switches 208, 210 may also be formed in a variety of configurations. For example, switches 208 and 210 may be formed using transistors (e.g., field effect or bipolar transistors), and charge sources 204, 206 may be formed using additional transistors. Exemplary circuits suitable for use as transient suppression regulators, which may also include a sense circuit, are described in greater detail in the '187 application; in U.S. patent application Ser. No. 10/104,833 entitled METHOD AND APPARATUS FOR OPEN LOOP CONTROL OF POWER SUPPLY TRANSIENTS, filed Mar. 21, 2002.

In accordance with an exemplary embodiment of the present invention, digital controller 116 is configured to drive one or more regulators 102–108. Controller 116 may be further configured to receive a signal from circuit 202 and send information to one or more regulators 102–108 based on the received signal. By way of example, circuit 202 may send a signal, indicating that a transient event has been detected, to controller 116. In this case, controller 116 in turn sends a signal to one or more primary regulators 102–108 to cause the regulators to alter output in response (e.g., to change operating mode to provide current to the microprocessor at a higher rate) to the sensed transient event. Controller 116 may also be configured to provide protection against excessive currents, excessive transient response activity, faults, and the like.

Controller 116 may be configured as an analog or digital controller. In accordance with one exemplary embodiment of the invention, controller 116 is a digital controller, which includes system monitoring devices. A more detailed description of a controller suitable for use with the present invention is described in U.S. patent application Ser. No. 10/103,980, entitled SYSTEM AND METHOD TO MAINTAIN VOLTAGE REGULATION DURING RAPID LOAD CHANGES IN VOLTAGE REGULATOR MODULES, filed Mar. 22, 2002.

Figure 3:
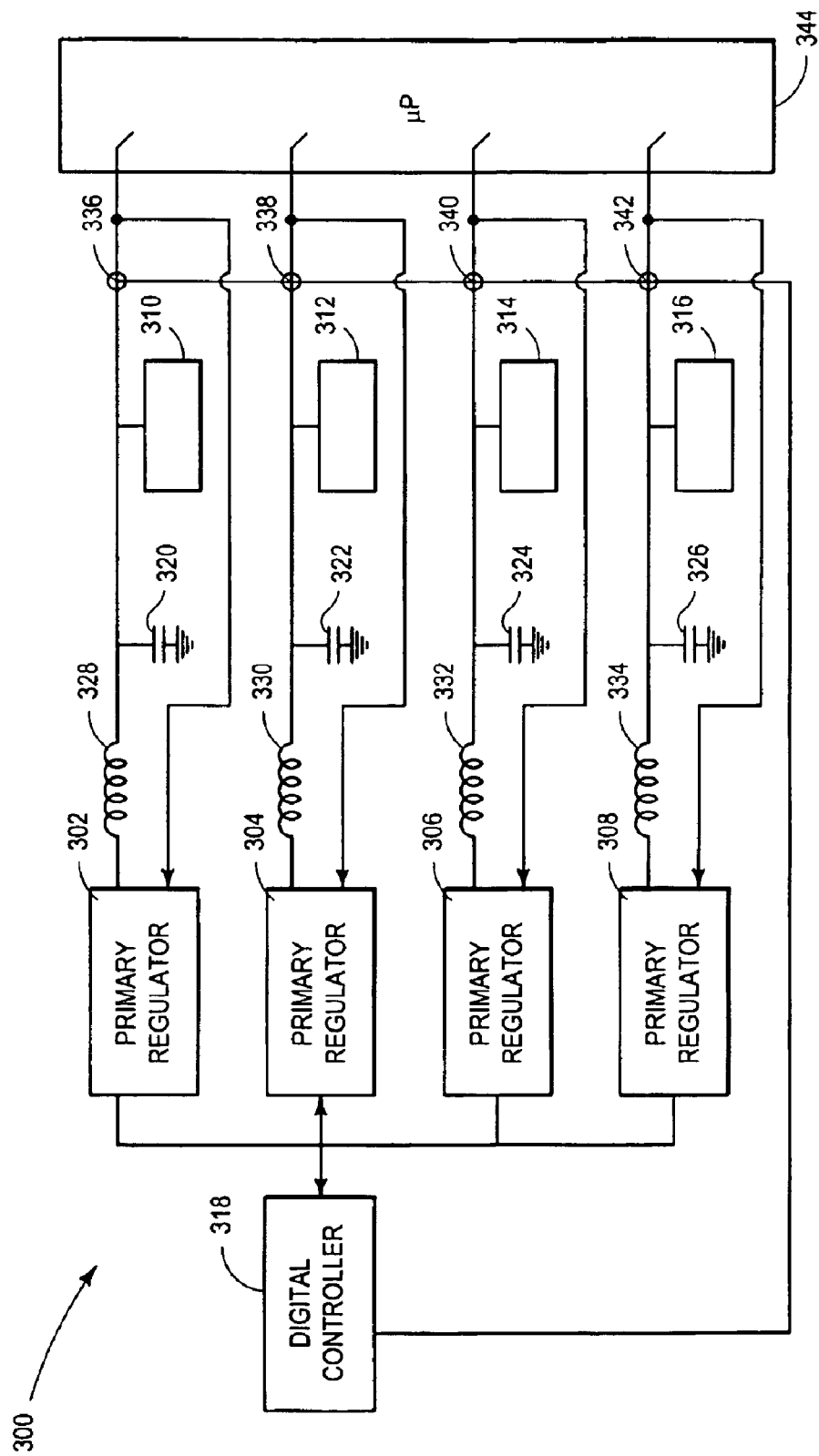
FIG. 3 illustrates a power regulation system in accordance with an alternate embodiment of the invention.

FIG. 3 illustrates a power regulation system 300 in accordance with another exemplary embodiment of the invention. System 300 includes primary regulators 302–308, transient suppression regulators 310–316, a controller 318, capacitors 320–326, inductors 328–334, and sense circuits 336–342, coupled to a microprocessor 344. System 300 is similar to system 100, except system 300 is configured to supply independently controlled operating power to a plurality of locations on microprocessor 344. In accordance with various aspects of this embodiment, each primary regulator 302–308 is configured to provide independently controlled power to an independent or isolated portion of microprocessor 344. An independent portion of microprocessor 344 may include, for example, a group of related processor units for power delivery purposes (e.g., floating point unit memory unit, input/output unit, or the like) separated from other units or portions using suitable dielectric material and power grid formation techniques. Alternatively or in addition to providing power to various units of the microprocessor, the microprocessor may be divided into spacial portions, and power may be independently supplied to the spatial portions of the microprocessor using a plurality of regulators 302–308. By providing power to various units and/or portions of the microprocessor, system 300 is able to quickly respond to changes in power demands, e.g., to transient events, and system 300 may be configured to tailor supplied power according to the operation of portions and/or units of the microprocessor, rather than supplying one operating voltage to the entire microprocessor. In addition, each regulator 302–308 may be independently powered up or down, depending on operating conditions of a portion of the microprocessor, rather than based on operating conditions of the entire microprocessor.

Power regulators 302–308 may be configured as any of regulators 102–108 described above. In accordance with one embodiment of the invention, regulators 302–308 are switching regulators and at least one of regulators 302 is a multi-phase switching regulator. In accordance with one aspect of this embodiment, one or more regulators 302–308 are configured such that the output of at least one of the regulators differs from the output of other regulators, such that power supplied to one portion of microprocessor 344 differs from power supplied to another portion of the microprocessor.

Similarly, transient suppression regulators 310–316 may include any combination of the transient suppression regulators 110–114 described above in connection with FIG. 1. In accordance with one embodiment of the invention, each regulator 302–308 is coupled in parallel with a corresponding transient regulator 310–316. However, in accordance with other embodiments of the invention, one or more regulators 302–308 may not be coupled to a transient suppression regulator and one or more regulators 302–308 may be coupled, in parallel, to a plurality of transient regulators. In accordance with other embodiments of the invention, one or more transient suppression regulators may be power by yet another power source such as an unregulated power supply (e.g., an alternating current/direct current converter).

Sense circuits 336–342 may comprise any one or more of the sense circuits described above in connection with sense circuit 202, illustrated in FIG. 2. In accordance with one exemplary embodiment, at least one sense circuit 336–342 includes a di/dt sense circuit configured to quickly detect a transient event and send a corresponding signal to one or more transient suppression regulator 310–316 and optionally to controller 318. Although illustrated with four sense circuits, power regulation systems in accordance with the present invention may include any desired number and any desired combination of configurations of sense circuits. For example, a system may include only one sense circuit that communicates with a plurality of transient suppression regulators and optionally to a controller.

In accordance with an alternate embodiment of the invention, microprocessor 344 may be configured to supply a predictive signal indicative of occurrence of a likely transient event. A microelectronic device and system including a device with a predictive signal generator is described in detail in U.S. patent application Ser. No. 10/104,227 entitled METHOD, APPARATUS & SYSTEM FOR PREDICTIVE POWER REGULATION TO A MICROELECTRONIC CIRCUIT and filed Mar. 21, 2002, the contents of which are hereby incorporated by reference.

Similar to controller 116, controller 310 is generally configured to drive one or more regulators 302–308. Further, controller 310 may be configured to receive a signal from one or more sense circuits 336–342 and send a corresponding signal to one or more primary regulators 302–308 to cause one or more of the regulators to temporarily alter an operating condition in response to the sensed transient event. Controller 318 may be further configured to power up, power down, or alter operating parameters such as duty cycle and the like of one or more regulators 302–308 in response to a sensed operating conditions or other suitable signal.

Figure 4:
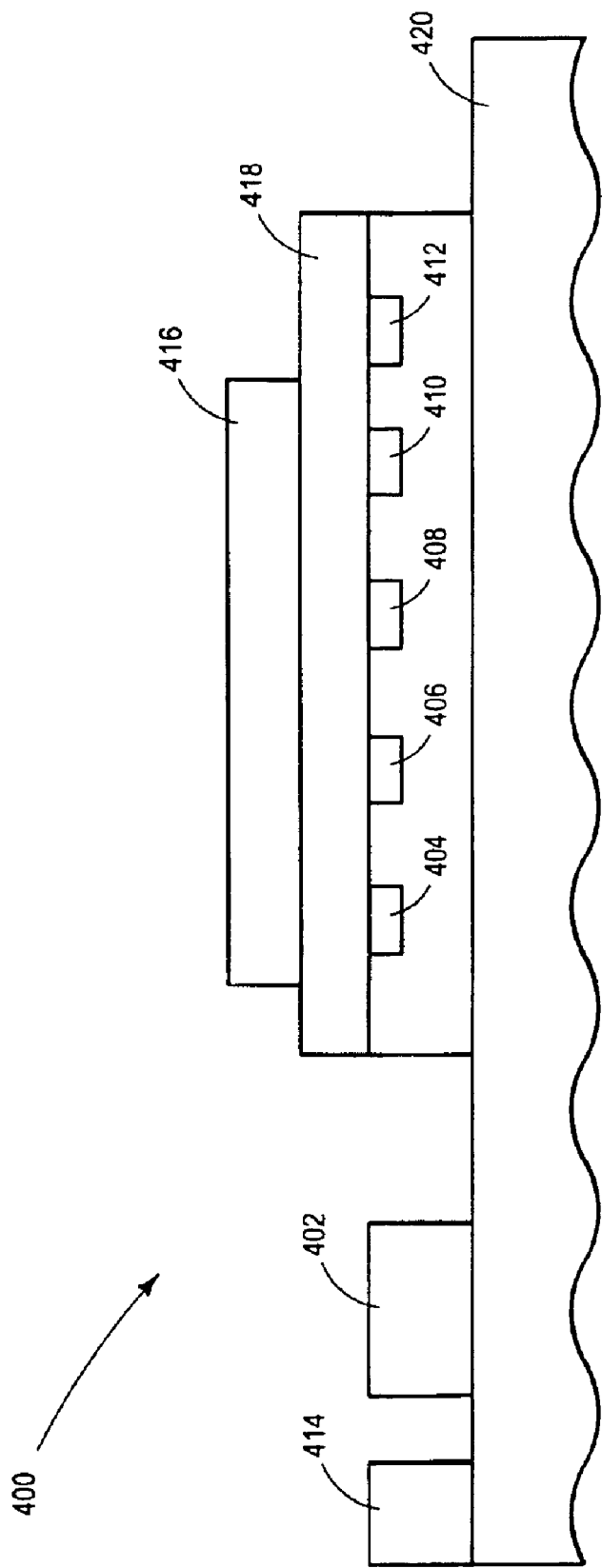
FIG. 4 illustrates, in cross-section, a power regulation system in accordance with a further exemplary embodiment of the invention.

FIG. 4 schematically illustrates a power regulation system 400, including a primary regulator 402, a plurality of transient suppression regulators 404–412, and a controller 414 coupled to a microprocessor 416. In accordance with the exemplary illustrated embodiment, transient suppression regulators 404–412 are coupled (e.g., using bump technology) to a substrate 418 such multi-layered fire-resistant printed circuit board, to which microprocessor 416 is also coupled (e.g., using bump technology). In accordance with other embodiments of the invention, regulators 404–412 may be attached to the microprocessor using Bumpless Build-Up Layer (BBUL) technology. In accordance with yet another embodiment of the invention, regulators 402 and 404–412 may be packaged together and coupled either directly or indirectly to the microprocessor.

In further accordance with embodiment illustrated in FIG. 4, primary regulator 402 is coupled to a second substrate 420 such as another printed circuit board (e.g., a mother board of a computer system) and is coupled to microprocessor 416 and to at least one of regulators 404–412. Alternatively, regulators 404–412 may be coupled to another power source. Forming or attaching regulator 402 to a second substrate may be advantageous because any heat generated by the regulator may be more easily dissipated and is less likely to affect performance of microprocessor 416.

Although illustrated as a separate component, controller 414 (or controllers 116, 318) may suitably be integrated with any of microprocessor 416, secondary regulators 404–412, or primary regulator 402. In accordance with one exemplary embodiment of the invention, controller 414 is a discrete circuit coupled to primary regulator 402 and a sense circuit (not illustrated, which may be formed as part of any of regulators 404–412 as described above) and/or to microprocessor 414 using conductive layers on or within substrate 420.

Figure 5:
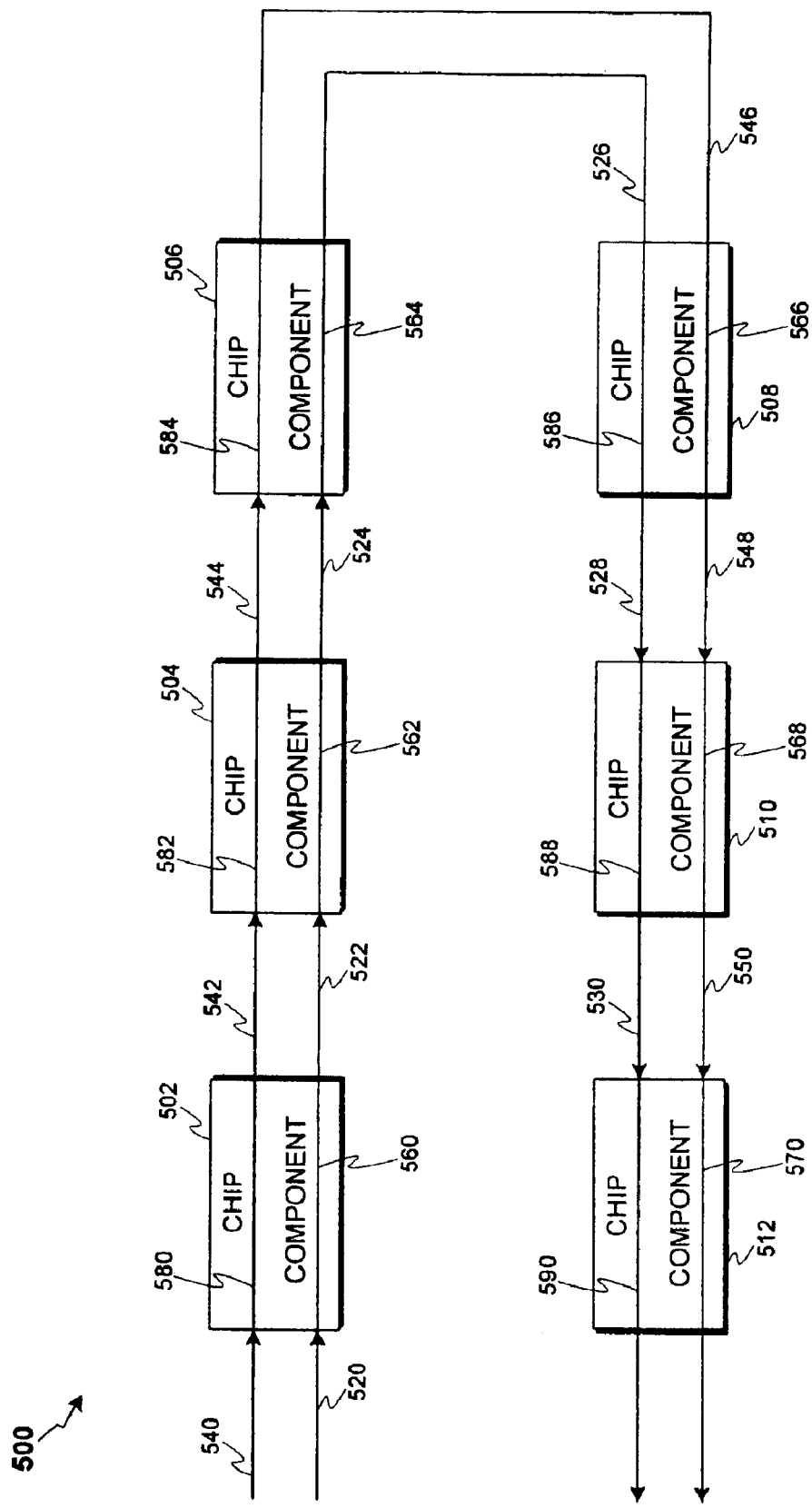
FIG. 5 illustrates an exemplary configuration for a routing scheme in accordance with an embodiment of the present invention.

FIG. 5 illustrates a system 500 with an exemplary routing layout in accordance with another exemplary embodiment of the present invention. System 500 includes chip components 502–512 connected by signal lines 520–530, 540–550 such that the chip components are connected in a serial pattern. System 500 may include any suitable number of chip components which may or may not be isolated from each other. Chip components 502–512 may suitably comprise any discrete chip component such as primary power regulators, transient suppression regulators, and the like, which are coupled (e.g., using bump technology) to a substrate such as a printed circuit board (not shown in FIG. 5, see 418 of FIG. 4). Signal lines 520–530, 540–550 are suitably formed on the substrate utilizing standard metallization processes such as a copper metallization process, however, any other reasonably conductive material may also be utilized for the signal lines.

Bus lines 560–570, 580–590, used for transferring the signal carried by signal lines 520–530, 540–550, are included within the chip components 502–512. The bus lines are formed such that the bus line provides a continuous electrical connection from the signal lines 520–530, 540–550 formed on the substrate, through the chip component, and back to the substrate. Bus lines 560–570, 580–590 are also formed from any suitable conductive material such as aluminum, copper, and the like.

In operation, signal lines 520–530, 540–550 may be used to transfer any suitable signal such as a power signal, a ground signal, a clock signal, an input signal, an output signal, an information signal, or any other signal that may be transferred through the chip. Information may be transferred through the signal lines to the chip components 502–512. The transferred information may be used by one or by any combination of the chip components. For example, the signal that is transferred along signal lines 520–530, 540–550 may be used by the third chip component 506, but not by the second component 504. Stated another way, the signal lines of system 500 may used to provide a signal to any individual chip component or to any combination of chip components.

Figure 6:
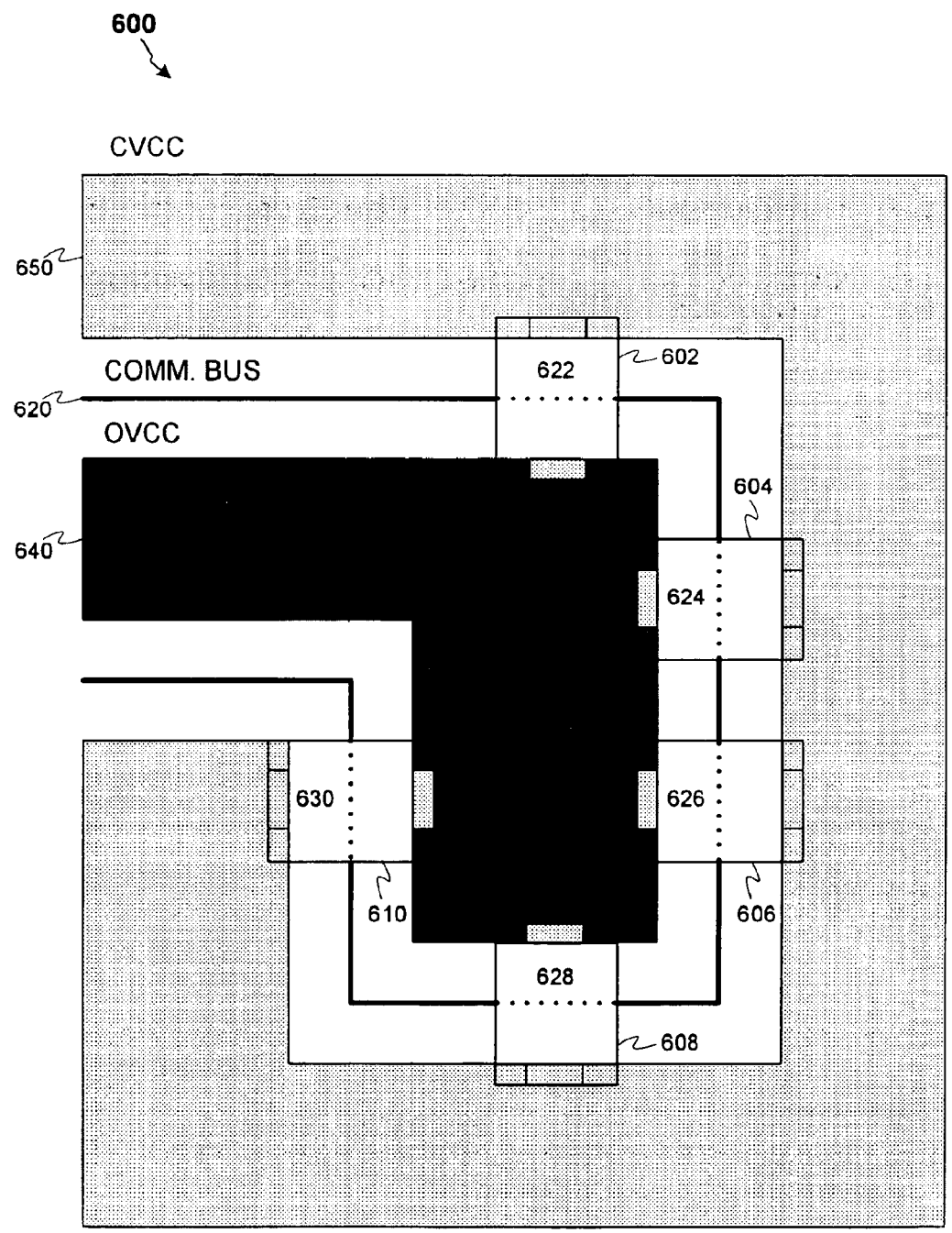
FIG. 6 illustrates an exemplary configuration for a routing scheme in accordance with a further embodiment of the present invention.

A system 600 in accordance with another embodiment of the present invention is illustrated in FIG. 6. System 600 includes transient suppression regulators 602–610, a communication bus 620, core power supply (CVCC) 650, and output device power supply (OVCC) 640. Transient suppression regulators 602–610 may include any combination of the transient suppression regulators 110–114 described above in connection with FIG. 1 or the transient suppression regulators 310–316 described above in connection with FIG. 3. OVCC may be used to bias the regulator's output device (not shown). CVCC may be used to bias the remaining portion of the chip (i.e., everything but the output device). Regulators 602–610 may be coupled, for example using bump technology, to OVCC 640 and CVCC 650.

In accordance with various aspects of this embodiment, each regulator 602–610 has transmission paths 622–630 for communication bus 620 that is formed on each regulator 602–610. Transmission paths 622–630 may be formed from any suitable conductive material such as aluminum, copper, and the like. Furthermore, systems in accordance with the present invention may include additional components, such as resistors, transistors, additional capacitors and/or inductors, and the like, which are not illustrated in the drawing figures. Transmission paths 622–630 may be formed using deposition and etch or damascene techniques as commonly used in the semiconductor manufacturing field.

The through signal routing provided by the present invention allows for continuous CVCC and OVCC, while providing a connection to various chip components such as secondary regulators. In addition, the signal routing of the present invention eliminates the need to cut a signal line and move it down a layer in order to complete the signal routing.

Figure 7:
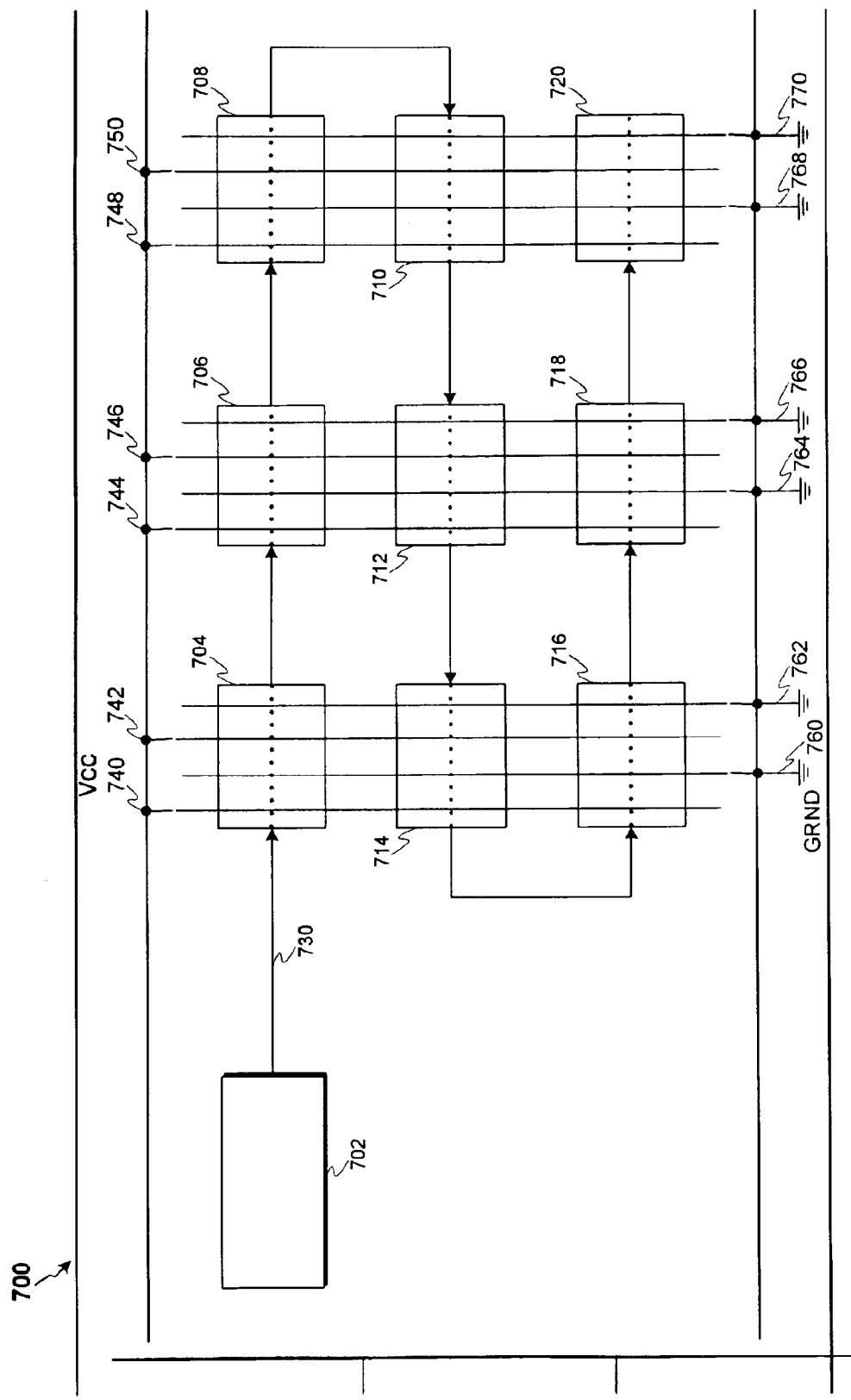
FIG. 7 illustrates an exemplary configuration for a routing scheme in accordance with another embodiment of the present invention.

A system 700 in accordance with another embodiment of the invention is illustrated in FIG. 7. System 700 includes a plurality of transient suppression regulators 704–720 coupled (e.g., using bump technology) to a substrate such as a printed circuit board. Transient suppression regulators 704–720 may include any combination of the transient suppression regulators 110–114 described above in connection with FIG. 1, the transient suppression regulators 310–316 described above in connection with FIG. 3, or the transient suppression regulators 602–610 described above in connection with FIG. 6. As illustrated, the substrate includes a signal line 730 coupled to the plurality of regulators 704–720 and to a digital controller 702, where the signal line is partially formed on the substrate, and partially formed within the regulators. Similar to controller 116 of FIG. 1, controller 702 is generally configured to drive one or more regulators 704–720. Further, controller 702 may be configured to send and receive signals from regulators 704–720. System 700 also includes power (Vcc) lines 740–750 and ground lines 760–770 formed on the substrate, which run continuously on the substrate. In accordance with one aspect of this embodiment of the present invention, the power and ground lines may alternate to reduce the amount of noise transferred between neighboring lines.

In accordance with an exemplary embodiment of the present invention, digital controller 702 is configured to drive one or more regulators 704–720. Controller 702 may be further configured to receive a signal and send information to one or more regulators 704–720 based on the received signal. By way of example, controller 702 may receive a signal, indicating that a transient event has been detected. In this case, controller 702 in turn sends information indicating that the transient event has occurred by way of a signal to one or more regulators 704–720 utilizing signal line 730.

Controller 702 may be configured as an analog or digital controller. In accordance with one exemplary embodiment of the invention, controller 702 is a digital controller, which includes system monitoring devices. A more detailed description of a controller suitable for use with the present invention is described in U.S. patent application Ser. No. 10/103,730, entitled SYSTEM AND METHOD TO MAINTAIN VOLTAGE REGULATION DURING RAPID LOAD CHANGES IN VOLTAGE REGULATOR MODULES, filed Mar. 22, 2002.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in the power regulation systems of the present invention.

The present invention has been described above with reference to exemplary embodiments. Those skilled in the art having read this disclosure will recognize that changes and modifications may be made to the embodiments without departing from the scope of the present invention. For instance, the present invention has been described in connection with coupling various components to printed circuit board substrates; however various other substrates and packages may be used to couple the components. These and other changes or modifications are intended to be included within the scope of the present invention, as expressed in the following claims.

We claim:

1. A system comprising:
    a controller configured to receive a transient event detection signal and to send an information signal in response to the transient event detection signal;
    a plurality of transient suppression regulators, wherein at least one transient suppression regulator is configured to receive the information signal; and
    a signal line connecting the controller and the plurality of transient suppression regulators, wherein the signal line is configured to route through each of the regulators, and wherein the information signal is transmitted along the signal line.

2. The system of claim 1, further comprising a sense circuit configured to detect a transient power event and coupled to at least one of the plurality of the transient suppression regulators.

3. The system of claim 2, wherein the sense circuit comprises a voltage sense circuit.

4. The system of claim 2, wherein the sense circuit comprises a di/dt sense circuit.

5. The system of claim 2, wherein the sense circuit comprises a di/dt sense circuit and a voltage sense circuit.

6. A system for routing signals to portions of a microelectronic device, the system comprising:
    a substrate;
    a plurality of power regulators coupled to the substrate, the power regulators configured to provide transient suppression power to the microelectronic device;
    a signal line formed on the substrate, wherein the signal line connects each of the power regulators in a serial pattern; and
    wherein each of the power regulators has a transmission path for the signal line.

7. The system of claim 6, further comprising a core power supply coupled to the power regulators.

8. The system of claim 6, wherein each of said power regulators comprises:
    a switchable current source.

9. The system of claim 6, wherein each of said power regulators comprises:
    a sense circuit.

10. The system of claim 6, wherein each of said power regulators comprises:
    a current source and a current sink.

11. The system of claim 6, wherein each of said power regulators comprises:
    a sense circuit;
    a controller coupled to the sense circuit; and
    a current source and a current sink selectively activated in response to a signal provided by the controller.

* * * * *